United States Patent [19]

Hung et al.

[11] Patent Number: 4,614,704

[45] Date of Patent: Sep. 30, 1986

[54] STABLE UV CURABLE COMPOSITIONS COMPRISING TRIPHENYL PHOSPHITE FOR FORMING SOLDER MASK COATINGS OF HIGH CURE DEPTH

[75] Inventors: Paul L. K. Hung, Edison; Mark L. Lavach, Stanhope, both of N.J.

[73] Assignee: M&T Chemicals Inc., Woodbridge, N.J.

[21] Appl. No.: 747,478

[22] Filed: Jun. 21, 1985

[51] Int. Cl.[4] .......................... G03C 1/70; G03C 1/71
[52] U.S. Cl. ..................................... 430/284; 430/913; 430/916; 430/926; 430/927; 522/18
[58] Field of Search ...................... 204/159.15, 159.23; 430/281, 284, 287, 913, 916, 926, 927, 270, 915

[56] References Cited

U.S. PATENT DOCUMENTS

| | | | |
|---|---|---|---|
| 3,883,352 | 5/1975 | Kloczewski et al. | 430/287 |
| 3,887,450 | 6/1975 | Gilano et al. | 430/281 |
| 4,046,577 | 9/1977 | Muzyczko et al. | 430/284 |
| 4,269,931 | 5/1981 | Suzuki et al. | 430/284 |
| 4,458,007 | 7/1984 | Geissler et al. | 430/284 |
| 4,506,004 | 3/1985 | Sullivan | 430/312 |
| 4,508,916 | 4/1985 | Newell et al. | 204/159.13 |

*Primary Examiner*—Richard L. Schilling
*Attorney, Agent, or Firm*—S. H. Parker; J. Matalon; R. Bright

[57] ABSTRACT

A method and composition for increasing the cure depth of a solder mask coating at a low UV energy level. The stable composition, which includes a UV curable compound and a photoinitiator, is characterized by the presence of triphenylphosphite in the composition.

3 Claims, No Drawings

STABLE UV CURABLE COMPOSITIONS COMPRISING TRIPHENYL PHOSPHITE FOR FORMING SOLDER MASK COATINGS OF HIGH CURE DEPTH

BACKGROUND OF THE INVENTION

1. Field of the Invention

This invention relates to solder mask coatings, and, more particularly, to a method and composition for increasing the cure depth of such coatings at a low energy level.

2. Description of the Prior Art

Sullivan, in U.S. Pat. No. 4,506,004, describes a contact method of imaging a liquid solder mask coating on a printed circuit board. In this method, the UV curable solder mask coating is screen printed to a given thickness, prehardened and imaged by exposure with suitable UV energy. The desired characteristics of good electrical performance and excellent printing resolution are given as the attributes of the Sullivan system. The requirements of a suitable photoability polymerizable compound for use in this process include an ability to form a smooth, flexible coating which can impart chemical and heat resistance to the solder mask. Furthermore, the coating must exhibit excellent adhesion to the board, and a singular ability to be cured to a desired depth with a minimum of UV energy.

A number of U.S. patents disclose compositions photopolymerizable prepolymers, photoinitiators and additives for making solder masks for printed circuit boards, including U.S. Pat. Nos. 3,660,088; 3,753,720; 3,883,352; 3,887,450: 4,199,163; 4,361,640; 4,458,007; and 4,508,916. However, none of these compositions are entirely satisfactory for use as a commercial solder mask, particularly as a solder mask in the liquid contact imaging system of U.S. Pat. No. 4,506,004, which requires a high cure depth of coating at a low UV energy level. Particularly, it is desired to provide additives in this composition which will improve cure depth under defined exposure conditions while keeping the composition stable towards premature gelation.

Accordingly, an object of this invention is to provide a method and composition which will produce a high cure depth solder mask coating, especially when such coating is prepared in the contact printing technique of U.S. Pat. No. 4,506,004.

Another object herein is to provide a UV cured solder mask coating having a depth of at least 18 mils when exposed to UV light above 300 nm.

Yet another object herein is to provide a stable solder mask composition which provides improved cure depth.

Still another object herein is to provide a method and composition for forming a high resolution solder mask coating of high cured depth at low energy levels.

These and other objects and features of the invention will be made apparent from the following more particular description of the invention.

SUMMARY OF THE INVENTION

What is described herein is a method and composition for increasing the cure depth of a solder mask coating at a low UV energy level. The composition, which includes a UV curable compound and a photoinitiator, is characterized in that triphenylphosphite is part of the composition. In this invention, the triphenylphosphite is present in an effective amount, suitably about 0.1 to 8% by weight of the composition, preferably about 0.4 to 5%, and, optimally, about 3%. In combination with a photoinitiator, the triphenylphosphite additive in the composition of the invention provides a cure depth of at least 18 mils at an energy level of 50 m J/cm$^2$.

The composition of the invention is further characterized by stability toward gelation for long periods of time, and the retention of the other desirable properties of a commercial solder mask composition.

DETAILED DESCRIPTION OF THE INVENTION

Typically, a UV composition without triphenylphosphite can provide a cure depth of only 13 mils or less when exposed to UV light. However, with triphenylphosphite, the cure depth is increased substantially, generally to 18 mils or greater. For example, using (i) a urethane diacrylate UV curable compound, which is made by condensation of toluene diisocyanate and two moles of hydroxypropyl acrylate, (ii) 1% by weight of a photoinitiator e.g. Irgacure 651 (Ciba-Geigy), (Michler's ketone), and 1% to 8% by weight of triphenylphosphite, provides cure depths of 15.5 to 21 mils, when exposed to a 1 kw medium pressure mercury vapor lamp through a ¼" glass slide in Test Method TM-6, using 50 mJ/cm$^2$ energy.

In order to retain other desirable properties of the composition, it is preferred to use about 2–4% by weight of triphenylphosphite and, optimally, about 3% by weight. Such compositions exhibit excellent stability towards gelation for long periods of time, even one year or more.

The combination of high cure depths at low energy levels, even when using UV light above 300 nm, long time storage stability, and retention of desired commercially acceptable physical and performance properties in application as a solder mask coating, makes the composition of the invention a significant improvement in the art.

While certain UV curable compounds and photoinitiators have been described, others known in the art and referred to in the aforementioned U.S. patents may be used as well.

The composition of the invention also may include reactive diluent monomers, which are ethylenically unsaturated monomers, e.g. mono-, di- and tri-acrylates and methacrylates as, for example, hydroxyalkyl acrylates, such as e.g. hydroxyethyl acrylate; and acrylate esters, e.g. methyl methacrylate, ethyl acrylate, 2-ethylhexyl acrylate, cyclohexyl acrylate, isobutoxymethyl methacrylate, t-butyl acrylate, methyl acrylate, butyl acrylate, 2-(N-ethylcarbamyl)ethyl methacrylate; aryloxyalkyl acrylates, e.g. phenoxyethyl acrylate; bisphenol-A diacrylate, ethylene glycol diacrylate, polyethylene glycol diacrylate, glycerol diacrylate and methacrylate, bis-phenol A diacrylate, tetrapropylene glycol diacrylate, and the like. Suitable triacrylates include glycerol triacrylate, ethoxylated trimethylol triacrylate, and the like.

Other reactive compounds can be included in the composition of the invention to increase the cross-linking density of the coating. Such reactive compounds include, but are not limited to, pentaerythritol 3-mercaptopropionate, 1,4-butylene dimethacrylate or acrylate, 1,1,6,-6-tetrahydroperfluorohexanediol diacrylate, ethylene dimethacrylate, glycerol diacrylate or methacrylate, glycerol trimethacrylate, diallyl phthalate and 1,3,5-tri(2-methacryloxyethyl)-s-triazine.

Suitable examples of photoinitiators include substituted and unsubstituted polynuclear quinones, such as 2-ethylanthraquinone, 2-t-butylanthraquinone, octamethylanthraquinone, 1,2-benzanthraquinone, 2,3-diphenylanthraquinone, thioxanthone, e.g. chloro and isopropyl derivates, and the like; ketoaldonyl compounds such, as diacetyl, benzyl and the like; α-ketoaldonyl alcohols and ethers, such as benzoin, pivalone, and the like; α-hydrocarbon-substituted aromatic acyloins such as α- phenylbenzoin, α,α-diethoxyacetophenone, and the like; and aromatic ketones such as benzophenone, 4,4′-bisdialkylaminobenzophenone, and the like. These photoinitiators may be used alone or as a combination of two or more of them. Examples of combinations include 2,4,5-triarylimidazole dimer and 2-mercaptobenzoquinazole, leucocrystal violet, tris(4-diethylamino-2-methylphenyl)methane, or the like, and compounds which may not have photoinitiating properties alone but which nevertheless can constitute a good photoinitiating system, in combination with the above-mentioned materials. Such compounds include, for example, tertiary amines, such as triethanolamine and the like, which are used in combination with benzophenone. These photoinitiators and/or photoinitiator systems preferably are present in an amount of about 0.5 to 10% by weight of the composition.

While the invention has been described with reference to certain embodiments thereof, it will be understood that changes and modifications may be made which are within the skill of the art.

What is claimed is:

1. A stable UV curable composition capable of forming coatings having a high cure depth comprising:
   (a) a UV curable compound which is a urethane diacrylate,
   (b) a photoinitiator, and
   (c) triphenylphosphite, in an effective amount of 0.1 to about 8% by weight of said composition, to provide said improved cure depth.

2. A stable UV curable composition according to claim 1, wherein said triphenylphosphite is present in an amount of 0.4 to 5% by weight of said composition.

3. A stable UV curable composition according to claim 1, wherein said triphenylphosphite is present in an amount of about 3% by weight of said composition.

* * * * *